April 18, 1967 W. M. ABERCROMBIE ETAL 3,314,830
SEMICONDUCTOR CONTACT ALLOY
Filed Aug. 3, 1964
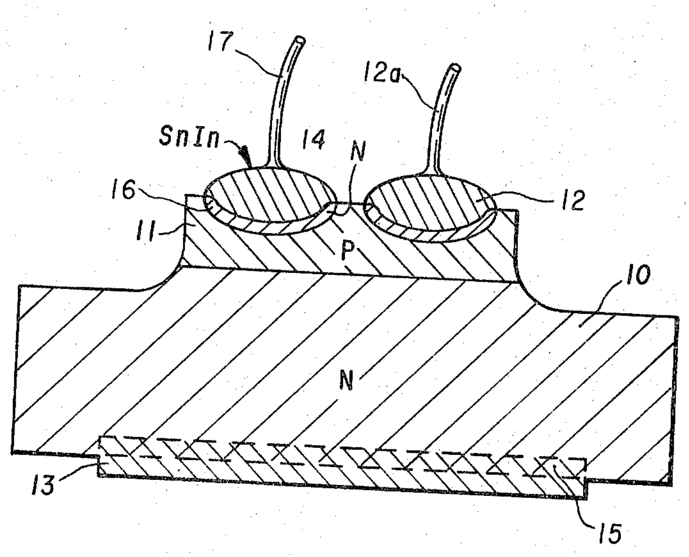
Wava M. Abercrombie
Ernest C. Wurst, Jr.
INVENTOR.
BY Harold Levine 3,314,830

SEMICONDUCTOR CONTACT ALLOY

Wava M. Abercrombie and Ernest C. Wurst, Jr., Dallas, Tex., assignors to Texas Instruments Incorporated, Dallas, Tex., a corporation of Delaware Filed Aug. 3, 1964, Ser. No. 386,862
2 Claims. (Cl. 148—33)

This invention relates to contact materials for semiconductor devices, such as transistors, and more particularly to alloys used for the formation of the emitter of an N–P–N Groups III–V compound transistor, and more specifically a gallium arsenide transistor.

One way of specifying the quality or figure of merit of a transistor is by stating the fraction of the emitter current which becomes collector current. This fraction is called the current multiplication factor, alpha ($\alpha$). When a transistor is connected with the signal in the base circuit in a common emitter arrangement, the current gain, beta ($\beta$), is the ratio of the collector current to the base current and is commonly expressed by the general formula $$\alpha/1-\alpha=\beta$$

Since alpha is a measure of emitter current which crosses the collector junction, it will be seen that alpha is a product of at least three factors: (1) emitter efficiency (sometimes called injection efficiency), (2) base transport efficiency, and (3) collector efficiency. It will be understood that each of these factors is expressed in terms of efficiency, hence can never have a value greater than unity. Consequently, alpha, being a product of these three factors, can be no higher than the lowest of these three efficiencies.

Briefly, the present invention relates to a novel transistor emitter alloy containing indium and tin which, when alloyed to a thin P-type layer on an N-type wafer, particularly of N-type gallium arsenide, unexpectedly produces a gallium arsenide transistor with an advantageously high emitter efficiency.

It is therefore an object of the present invention to provide an improved transistor emitter contact material.

It is also an object of the invention to provide an N–P–N gallium arsenide transistor having a high emitter efficiency.

It is a further object of this invention to provide a gallium arsenide transistor with a high current multiplication factor.

It is yet a further object of this invention to provide a gallium arsenide transistor having a novel emitter contact and improved emitter efficiency.

These and other objects, features, and advantages will become more readily understood from the following detailed description taken in conjunction with the appended claims and attached drawing which is a view in cross-section of a gallium arsenide transistor device embodying the principles of the present invention.

The transistor illustrated in the sole figure of the drawing comprises a wafer 10 of N-type single crystal gallium arsenide having a P-type layer 11 formed on its upper surface, for example by diffusion. A suitable ohmic contact 12, for example an alloy of gold and zinc, is alloyed to the P-type layer 11 to form the base contact. An electrical lead **12*a* forms part of the contact 12. An emitter alloy 14, containing tin (which is an N-type dopant) and indium in proportions as hereinafter described, is also alloyed to the top surface of P-type layer 11 to form a barrier or rectifying junction therewith. A suitable ohmic contact 13, 15, for example platinum combined with a gold-selenium alloy, is attached and electrically connected to the opposite surface of the wafer 10. It will be understood that in the transistor shown and described, wafer 10 constitutes the collector, P-type layer 11 constitutes the base, and alloy 14** forms the emitter.

With the exception of the emitter alloy, the above-described gallium arsenide transistor is representative of known compound semiconductor transistors. Hence the conventional processes for making such devices which include the necessary steps of etching, cleaning, and diffusing have been omitted as they form no part of this invention.

In the conventional N–P–N gallium arsenide transistor, the emitter is formed by alloying a contact which contains N-type impurities to the P-type layer 11. A conventional N-type impurity used for this purpose is tin, which acts as an electron donor in gallium arsenide and therefore may be used as the emitter contact. However, transistors produced using this conventional N-type impurity consistently exhibit low values of beta ($\beta$) which are generally attributed to poor emitter efficiency.

Since gallium arsenide is a compound of elements from Groups III and V of the Periodic Table, it would ordinarily be expected that other elements from Group III would enter the gallium arsenide crystal lattice substitutionally, that is, by replacing the gallium. Further, since the elements of Group III all have three electrons in their outermost electron orbital, it would also be expected that the substitution of other Group III elements for gallium in the gallium arsenide lattice would produce no substantial change in the conductivity or conductivity-type of the parent gallium arsenide compound.

Yet in direct opposition to all expectations and surmises, applicants have discovered that, surprisingly, alloys containing both tin and indium produce emitter contacts for gallium arsenide transistors that have unexpectedly high values of beta. Applicants know of no explanation for this phenomenon. While we do not wish to be bound by any theories, it may be assumed that since only the composition of the emitter alloy has been changed the indium advantageously improves the emitter efficiency.

To test the efficiency of the tin-indium emitter contacts for gallium arsenide signal translating devices, two groups of gallium arsenide transistors were produced. A slice of single crystal N-type gallium arsenide was first polished and diffused with magnesium in a sealed ampoule for one hour at 1100° C. This diffusion process produced a P-type diffused layer approximately 0.24 mil thick. The sheet resistance at the surface of the diffused layer measured 51 to 53 ohms. The diffused layer was removed from all except one surface of the slice, and the slice was then cut into small dice or wafers approximately 20 mils by 20 mils. The wafers were separated into two groups of equal number.

Transistors were made from one group by placing the N-type surface of the wafers each on a thin strip of gold, containing one percent selenium by weight, which in turn rested on a thin strip of platinum. A two-mil diameter sphere of 99.999% pure tin was placed on the P-type surface. The assembly was then briefly (about 3 seconds) heated to approximately 450° C. on a conventional strip heater. During this heating step, the gold-selenium alloy alloyed to both the N-type side of the gallium arsenide wafer and to the platinum strip to form an ohmic collector contact 13, 15. The tin sphere alloyed to the P-type layer to form an N-type emitter regrowth region 16. A gold-zinc (96% Au–4% Zn) wire 12 was thereafter alloyed to the P-type surface to form an ohmic base connection 12 and lead **12*a*. A two-mil diameter silver wire 17 was attached to the tin emitter sphere 14**.

Transistors were made from the second group of wafers in precisely the same manner as described above with the single exception that two-mil diameter spheres of an alloy of tin containing 0.05 percent indium by weight were substituted for the pure tin emitter spheres. The transistors made from both groups were then tested. The transistors from the first group (having pure tin emitters) exhibited beta values of less than unity, while those made from the second group and having the tin-indium emitter exhibited beta values ranging from five to 50 and values of $F_t$ (cut-off frequency) in excess of 200 megacycles.

As another example illustrating this invention, we have found that these advantageous results were also obtained with an emitter alloy which contained tin and 2.0 percent indium by weight. Thus it has been shown that this invention provides an emitter alloy which advantageously improves the electrical characteristics of N–P–N gallium arsenide transistors.

It is to be understood that this invention is not limited to emitter alloys containing only tin and indium, but is expressly intended to include other emitter alloys in which tin is the N-type impurity. For example, the invention may be used to improve the electrical characteristics of gallium arsenide transistors using high temperature emitter contacts such as those described in U.S. Patent No. 3,012,175 to M. E. Jones et al. and assigned to the assignee of the instant application, which patent describes emitter contact alloys comprising substantially equal atomic proportions of tin and gold or substantially equal atomic proportions of tin and silver and tin-gold. In these alloys, tin is the N-type impurity. By the addition of about 0.05% to about 2.0% by weight of indium in accordance with the present invention, the high emitter efficiency of the present invention is combined with the high temperature advantages of the Jones et al. alloys to produce high temperature N–P–N gallium arsenide transistors with improved current multiplication factors.

It is to be understood that the form of this invention, herewith shown and described, is to be taken as a preferred example of the same and that various changes may be resorted to without departing from the spirit and scope of the invention as defined by the appended claims.

What is claimed is:

1. In an N–P–N gallium arsenide transistor comprising a body of gallium arsenide defining contiguous N- and P-regions and having a rectifying contact alloyed to said P-region forming an N-type conductivity region therein, the improvement wherein said rectifying contact is an alloy containing about 0.05% to about 2.0% by weight of indium, the remainder of said alloy consisting essentially of tin.

2. In an N–P–N gallium arsenide transistor comprising a body of gallium arsenide defining contiguous N- and P-regions, and having a rectifying contact alloyed to said P-region forming an N-type conductivity region therein, the improvement wherein said rectifying contact is an alloy containing about 0.05% to about 2.0% by weight of indium the remainder of said alloy comprising substantially equal atomic proportions of tin and gold or substantially equal atomic proportions of tin and silver.

References Cited by the Examiner

UNITED STATES PATENTS

| | | | |
|---|---|---|---|
| 2,636,820 | 4/1953 | Bolton | 75—175 |
| 3,012,175 | 12/1961 | Jones et al. | 148—185 X |
| 3,041,508 | 6/1962 | Henkel et al. | 148—185 X |
| 3,110,849 | 11/1963 | Soltys | 148—185 X |
| 3,114,088 | 12/1963 | Abercrombie | 148—185 X |
| 3,181,979 | 5/1965 | Baron et al. | 148—185 X |

OTHER REFERENCES

Hansen: Constitution of Binary Alloys, McGraw-Hill Book Co., New York, 1958, pages 860–863 relied on.

DAVID L. RECK, *Primary Examiner.*

CHARLES N. LOVELL, *Examiner.*